United States Patent [19]

Lasagna et al.

[11] Patent Number: 5,015,878
[45] Date of Patent: May 14, 1991

[54] CIRCUIT FOR PROCESSING THE SIGNAL GENERATED BY A VARIABLE-RELUCTANCE ELECTROMAGNETIC ROTATION SENSOR

[75] Inventors: Diego Lasagna, Chieri; Francesco P. Mandara, Turin, both of Italy

[73] Assignee: Marelli Autronica S.p.A., Milan, Italy

[21] Appl. No.: 426,378

[22] Filed: Oct. 25, 1989

[30] Foreign Application Priority Data

Oct. 25, 1988 [IT] Italy .................. 67957 A/88

[51] Int. Cl.[5] .......................................... H03K 5/153
[52] U.S. Cl. ................... 307/358; 307/309; 328/5
[58] Field of Search ............... 307/261, 350, 354, 358, 307/359, 309; 328/5, 108, 115–117

[56] References Cited

U.S. PATENT DOCUMENTS

| 3,944,936 | 3/1976 | Pryor | 307/354 |
| 3,991,733 | 11/1976 | Harris | 307/354 |
| 4,267,470 | 5/1981 | Kawakami et al. | 307/358 |
| 4,429,235 | 1/1984 | Minner | 307/261 |
| 4,687,952 | 8/1987 | Capizzi, Jr. | 307/261 |
| 4,922,757 | 5/1990 | Rozelle et al. | 307/358 |

FOREIGN PATENT DOCUMENTS 0166699  1/1986  European Pat. Off. .

*Primary Examiner*—John Zazworsky
*Attorney, Agent, or Firm*—Sughrue, Mion, Zinn, Macpeak & Seas

[57] ABSTRACT

The circuit comprises a first threshold comparator (2,3) with hysteresis which is arranged to provide a reference signal ($V_c$) indicative of the zero-crossing of the sensor signal ($V_p$). Also connected to the sensor (P) is an integrator circuit (4) whose output is connected to the input of a second threshold comparator (7). The latter provides an inabling output signal ($V_e$) only when the integrated signal ($V_i$) exceeds a reference signal ($V_2$) whose amplitude varies in a predetermined manner in dependance on the amplitude of the integrated signal ($V_i$). An inabling circuit (14) is connected to the two threshold comparators (2,3;7) and outputs the signal ($V_c$) generated by the first comparator (2,3) only when the second comparator (7) emits an enabling output signal ($V_e$).

2 Claims, 1 Drawing Sheet

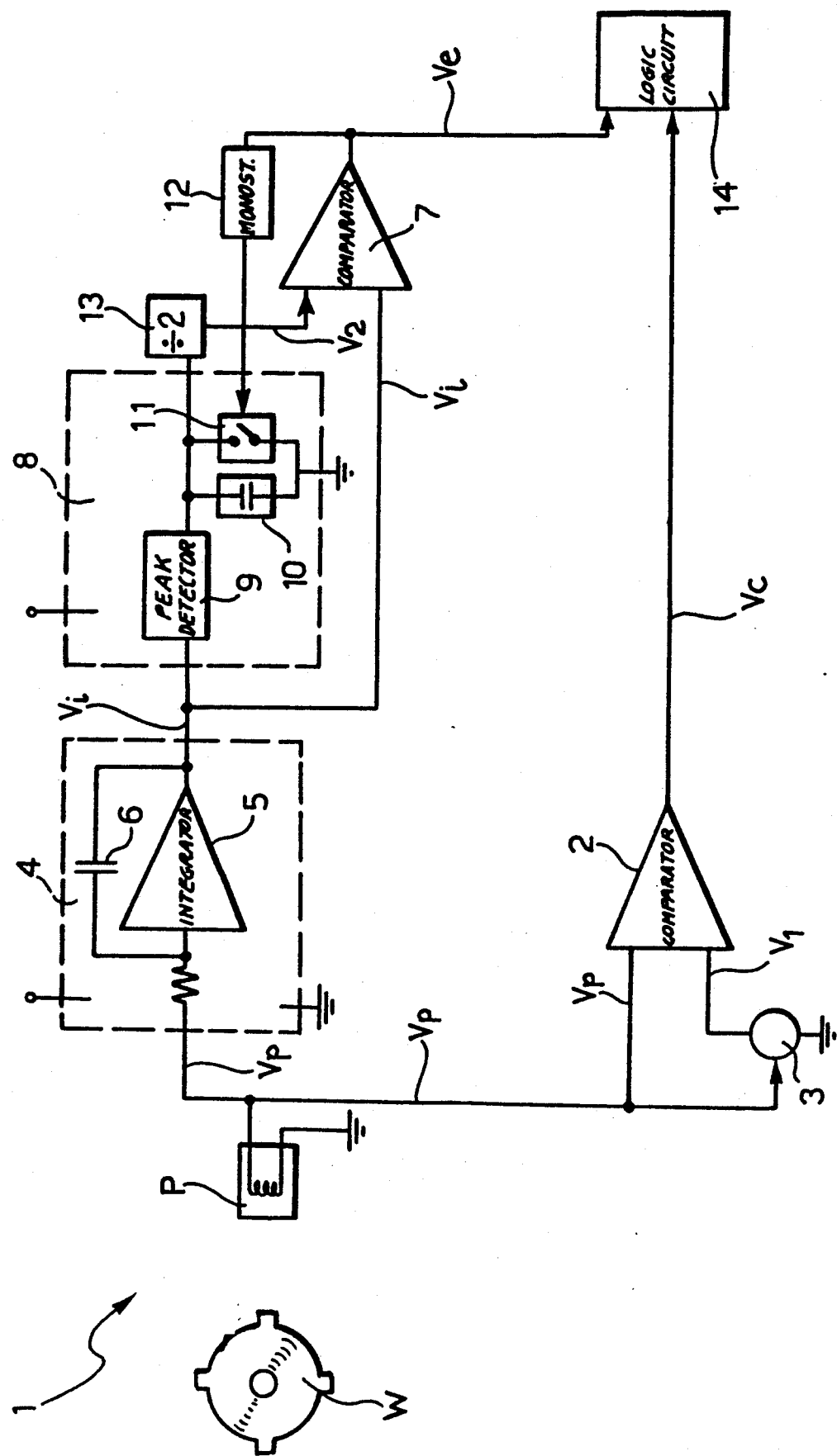

CIRCUIT FOR PROCESSING THE SIGNAL GENERATED BY A VARIABLE-RELUCTANCE ELECTROMAGNETIC ROTATION SENSOR

The present invention relates to a circuit for processing a signal generated by a variable-reluctance electromagnetic rotation sensor of the so-called phonic wheel type, or the like.

In particular, the invention relates to a circuit comprising:

first threshold comparator means for comparing the signal provided by the sensor with a first threshold signal and providing an output reference signal indicative of the zero-crossing of this signal, an integrator circuit which is likewise intended to be connected to the sensor, second threshold comparator means for providing an enabling signal when the signal provided by the integrator exceeds a second threshold signal, and a logic circuit having first and second inputs connected to the output of the first and second comparator means respectively and arranged to transmit an output reference signal which is indicative of the zero-crossing of the signal of the sensor only when the second comparator means provide the enabling signal Variable-reluctance electromagnetic rotation sensors of the so-called phonic wheel type have various applications, particularly in the automotive field, for example, for the detection of the rate of rotation of the drive shaft or for detecting the moments at which pistons of the engine pass through top or bottom dead centre.

These sensors typically each comprise a toothed rotor which is rotated by a rotary member, and an associated inductive pick-up.

The detection of the passage of the rotary member with which the rotor is associated through predetermined angular positions is detected by the comparison of the signal of the pick-up with reference signals and/or the detection of the zero-crossing of the pick-up signal.

The signal typically provided by an electromagnetic rotation sensor of the type described above has an amplitude which varies greatly in dependence on the rate of rotation of the toothed rotor and in general is rather "dirty" in that its amplitude can be altered significantly as a result of pulsed interference picked up. The information obtainable by the comparison of the amplitude of this signal with reference levels can consequently be erroneous and is therefore in general not very reliable.

In the European patent application published with the number 0166699, in the name of the same Applicant, a circuit of the type specified above was proposed for avoiding the problems described above and therefore ensuring more reliable operation even in the presence of pulsed interference picked up by the pulse generated. In effect, whilst the amplitude of the signal provided by a variable-reluctance sensor varies considerably in dependence on the rate of rotation of the toothed rotor, the amplitude of the integral of the signal should, at least in theory, have a constant dynamic range: the integral of the pick-up signal is in effect proportional to the magnetic flux linkage between the rotor and the pick-up, which does not change with variations in the rate of rotation.

The circuit according to European patent application No. 0166699 therefore included a threshold comparator which compared the amplitude of the integrated signal with a constant-level threshold signal; only when the integrated signal exceeded the constant threshold signal did this comparator provide an enabling signal to a logic gate which, in this case, allowed the signal indicative of the zero-crossing of the signal generated by the sensor to proceed.

Tests and measurements carried out by the inventors, however, have ascertained that, for an identical angular position of the shaft with which the sensor is associated, the integral of the sensor signal has an amplitude which varies as the rate of revolution of the shaft varies in a unit of time. This amplitude is therefore not a characteristic which is invariable with variations in the rate of rotation of the rotor of the sensor.

Starting from this experimental finding, the object of the present invention is to provide a circuit of the above-mentioned type which has even more reliable and precise operation than those of the prior art.

This object is achieved, according to the invention, by means of a circuit of the type specified above, the main characteristic of which lies in the fact that the second comparator means comprise:

a generator circuit connected to the output of the integrator circuit for generating a threshold signal whose amplitude is variable in a predetermined manner in dependence on the amplitude of the signal emitted by the integrator circuit, and a comparator circuit for comparing the signal emitted by the integrator circuit with the threshold signal. According to a further characteristic of the invention, the threshold-signal generator circuit comprises:

a peak-detector circuit having its input connected to the output of the integrator circuit, storage means connected to the output of the peak-detector and to the threshold-signal input of the second comparator means, and circuit means for resetting the storage means, piloted by the second comparator means so as to reset the storage means each time the signal provided by the integrator circuit exceeds the threshold signal.

Further characteristics and advantages of the present invention will become clear from the detailed description which follows with reference to the appended drawings, provided by way of non-limiting example, in which the block diagram of a circuit according to the invention is shown.

In the appended drawing, a variable-reluctance electromagnetic rotation sensor of the phonic wheel type is generally indicated 1. In general, this comprises a toothed rotor W with which an inductive pick-up, indicated P, is associated.

The inductive pick-up P is connected to the input of a first threshold comparator with hysteresis, indicated as 2. This comparator is arranged so that its output changes state (for example, changing from high level to low level) when the signal $V_p$ provided by the pick-up exceeds the level of a threshold signal $V_1$ provided by a generator 3. The level of the threshold signal $V_1$ is conveniently a function of the amplitude of the signal $V_p$.

The comparator 2 changes state again when the signal $V_p$ falls below zero. In this case, each leading edge of the signal $V_c$ provided at the output of the comparator 2 is indicative of a zero-crossing of the signal $V_p$.

The pick-up P is also connected to the input of an integrator circuit, generally indicated as 4 and produced, for example, with the use of an operational amplifier 5 and a feedback capacitor 6. The signal $V_i$ provided at the output of the circuit 4 corresponds to the integral of the signal $V_p$ provided by the pick-up, and is applied to the input of the second threshold comparator 7, as well as to a sampling and storage circuit, generally indicated as 8. The latter circuit includes a peak-detector 9 to whose input the signal $V_i$ is applied, and a storage capacitor 10, connected to the output of the peak detector. A controlled switch, indicated 11, is arranged in parallel with the capacitor 10 and is constituted, for example, by a transistor. The switch is controlled by the output of a monostable circuit 12 whose input is connected to the output of the threshold comparator 7.

In the embodiment illustrated, the capacitor 10 and the switch 11 are connected between the output of the peak detector and earth. However, the circuit 8 may be produced in an equivalent form, in which the capacitor and the associated switch are connected between the output of the peak detector and the non-earthed pole of the supply voltage.

The output of the sampling and storage circuit 8 is connected to a divider circuit 13 which is arranged to divide the voltage of the signal applied to its input by a predetermined factor, for example by a factor of 2. The output of the voltage divider 13 is connected to a threshold comparator circuit 7.

The outputs of the threshold comparators 2 and 7 are connected to two inputs of a logic circuit indicated as 14.

In operation, when a tooth of the rotor W passes in front of the pick-up P, the latter emits a signal whose amplitude is initially positive and then suddenly changes its sign, passing through zero. The signal is integrated by the circuit 4 and the resulting signal $V_i$ is applied to the input of the peak detector 9. In this situation, the switch 11 is in its non-conducting condition or state, so the capacitor 10 is charged at the peak voltage reached by the integrated signal $V_i$. The threshold signal $V_2$ supplied to the comparator 7 by the voltage divider 13 therefore has an amplitude which is proportional to the peak value reached by the integral of the signal provided by the pick-up P. As soon as the signal $V_i$ exceeds the level of the signal $V_2$, the comparator 7 provides an output signal which enables the logic circuit 14 to output the signal $V_c$. The signal output by the threshold comparator 7 also activates the monostable circuit 12 which causes the switch 11 to switch to the conduction condition or state for a predetermined period of time, causing the rapid discharge of the capacitor 10. When this very short period of time has elapsed, the switch 11 returns to the non-conducting condition or state so that the capacitor 10 is ready to store the new peak value reached by the integrated signal $V_i$.

It is clear from the above explanation that the amplitude of the threshold $V_2$ is variable in dependence on the amplitude of the signal $V_i$ emitted by the integrator circuit 4. The operation of the circuit described as a whole can thus be made practically insensitive to variations in the amplitude of the integrated signal ($V_i$) which in practice may not be negligible.

What is claimed is:

1. A circuit for processing a signal generated by a variable-reluctance electromagnetic rotation sensor comprising:
   first threshold comparator means for comparing the signal provided by the sensor with a threshold signal and providing an output reference signal indicative of the zero-crossing of this signal;
   an integrator circuit connected to the sensor,
   second comparator means for providing an enabling signal when the signal provided by the integrator circuit exceeds a second threshold signal, and
   a logic circuit having first and second inputs connected to outputs of the first and second comparator means respectively and arranged to transmit an output reference signal which is indicative of the zero-crossing of the signal of the sensor only when the second comparator means provides the enabling signal,
   said second comparator means comprising:
   a threshold-signal generator circuit, connected to an output of the integrator circuit, for generating a threshold signal whose amplitude is variable in a predetermined manner depending on the amplitude of the signal emitted by the integrator circuit, and
   a comparator circuit having inputs thereto connected to the output of the integrator circuit and to an output of the threshold signal generator circuit, wherein said threshold-signal generator circuit comprises a peak-detector circuit having an input thereto connected to the output of said integrator circuit, storage means connected to the output of said peak-detector circuit, and reset circuit means for resetting said storage means, controlled by said second comparator means so as to reset said storage means each time the signal provided by said integrator circuit exceeds the threshold signal.

2. A circuit according to claim 1, wherein the storage means comprises a capacitor and the reset circuit means comprise a switch connected to the capacitor and controlled by a monostable circuit controlled by the output of the comparator circuit.

* * * * *